US007698578B2

(12) United States Patent
Williams et al.

(10) Patent No.: US 7,698,578 B2
(45) Date of Patent: Apr. 13, 2010

(54) TEMPERATURE-DEPENDENT POWER ADJUSTMENT OF TRANSMITTER

(75) Inventors: Richard Williams, Surrey (GB); Pauli Heikkinen, Oulu (FI); Jeff Brownlee, Hampshire (GB); Debbie Richardson, Reading (GB); Ilkka Savimäki, Fleet (GB); Gairn Kalla, Surrey (GB)

(73) Assignee: Nokia Corporation, Espoo (FI)

( * ) Notice: Subject to any disclaimer, the term of this patent is extended or adjusted under 35 U.S.C. 154(b) by 493 days.

(21) Appl. No.: 11/479,184

(22) Filed: Jun. 29, 2006

(65) Prior Publication Data

US 2008/0007192 A1    Jan. 10, 2008

(51) Int. Cl.
G06F 1/32 (2006.01)
G05D 23/20 (2006.01)
H02H 5/04 (2006.01)

(52) U.S. Cl. .................. 713/300; 713/310; 713/320; 713/323; 713/324; 318/471

(58) Field of Classification Search ............... 713/300, 713/310, 320–324, 330, 340; 318/471
See application file for complete search history.

(56) References Cited

U.S. PATENT DOCUMENTS

| 6,173,217 | B1 | 1/2001 | Bogin et al. ............. 700/299 |
| 6,760,311 | B1 * | 7/2004 | Raith ....................... 370/252 |
| 2004/0024561 | A1 * | 2/2004 | Huckaby et al. ......... 702/132 |
| 2005/0283561 | A1 | 12/2005 | Lee et al. ................ 710/307 |
| 2006/0116844 | A1 | 6/2006 | Gaur et al. .............. 702/130 |

FOREIGN PATENT DOCUMENTS

| EP | 1 143 627 A1 | 10/2001 |
| GB | 2 355 367 A | 4/2001 |
| WO | WO 96/33555 | 10/1996 |
| WO | WO 99/52218 | 10/1999 |
| WO | WO-00/31990 | 6/2000 |
| WO | WO 03/079170 | 9/2003 |

OTHER PUBLICATIONS

Intel Corporation, "System Memory Power and Thermal Management in Platforms Built on Intel Centrino Duo Mobile Technology", Intel Technology Journal, vol. 10, No. 2, May 15, 2006, pp. 123-132, XP002458106, ISSN 1535-864X.
Jugl E et al., "Performance Evaluation of Dynamic Data Rate Adaptation on the UMTS Dedicated Channel", The Institution of Electrical Engineers, Stevenage, GB; Jun. 27, 2003, Database accession No. 7691809, Fourth International Conference on 3G Mobile Communication Technologies, ISBN: 0-85296-756-X, pp. 104-108.
Mcubed Information Technology GmbH: Mining Manual, Nov. 2, 2005, Retrieved from the Internet: URL:http://222.t-balancer.com/download/mining.pdf.

* cited by examiner

*Primary Examiner*—Thomas Lee
*Assistant Examiner*—Fahmida Rahman
(74) *Attorney, Agent, or Firm*—Harrington & Smith

(57) ABSTRACT

A device includes a transmitter, at least one temperature sensor; and a controller. The controller is responsive to the at least one temperature sensor indicating that a temperature has risen above a first threshold to control the transmitter to reduce transmit power from a first power level to a second power level, wherein the second power level is a non-zero power level.

16 Claims, 3 Drawing Sheets

TEMPERATURE-DEPENDENT POWER ADJUSTMENT OF TRANSMITTER

FIELD OF THE INVENTION

This invention relates to a device including a temperature sensor and a radio transmitter. The invention relates also to a method of controlling a transmitter to reduce a transmit power.

BACKGROUND TO THE INVENTION

It is well known to attach modules to laptop or notebook computers to provide additional functionality thereto. Examples include Wi-Fi (IEEE 802.11) and 3G data card modules which connect to a laptop via a PCMCIA (Personal Computer Memory Card International Association) interface. It is known also to provide a Wi-Fi module as an ExpressCard, which is a form of PCI-Express device. Wi-Fi and 3G data modules also can be connected by USB (Universal Serial Bus) interface to a laptop computer.

Such modules can be external or internal. A module is powered by electrical power provided over the interface by which it is connected to the laptop computer. The main components of a module are a transceiver, a processor (which provides a control function as well as a processing function), buffer memory and an antenna connector. An antenna within the laptop can be connected to the module via the antenna connector. The presence of the processor and the memory results in operation of the modules being dependent on the ambient temperature falling within an acceptable range.

It is known to provide a module with a temperature sensor by which it can be detected whether the temperature of the module is above the upper limit of the acceptable range and thus close down the module's transmitter.

SUMMARY OF INVENTION

A first aspect of the invention relates to a device comprising: a radio transmitter; at least one temperature sensor; and a controller, wherein the controller is responsive to the at least one temperature sensor indicating that a temperature has risen above a first threshold to control the transmitter to reduce transmit power from a first power level to a second power level, wherein the second power level is a non-zero power level.

The invention allows operation of the transmitter to continue with a reduced contribution to increasing of ambient temperature. This is advantageous since it can allow the transmitter to continue to operate, albeit at a reduced power, whilst reducing the possibility of a maximum operating temperature being exceeded and transmitter operation ceased. Although power is reduced when the temperature rises above a threshold, this is considered to be acceptable considering that the probability of the transmitter being available at a given time is increased. The advantage is achieved because the heat generated by the transmitter is reduced as the transmit power is reduced.

Preferably the controller is responsive to the at least one temperature sensor indicating that a temperature has risen above a first threshold to control the transmitter to reduce a transmit data rate from a first transmit data rate to a second transmit data rate, wherein the second transmit bit rate is a non-zero transmit data rate, thereby to reduce transmit power.

This has particular applicability to WCDMA systems and is advantageous since it can allow the transmitter to continue to operate, albeit at a reduced data rate, whilst reducing the possibility of a maximum operating temperature being exceeded and transmitter operation ceased. Although data rate is reduced when the temperature rises above a threshold, this is considered to be acceptable considering that the probability of the transmitter being available at a given time is increased. The advantage is achieved because the heat generated by the transmitter is reduced as the transmit data rate is reduced.

Advantageously the controller is responsive to the at least one temperature sensor indicating that a temperature has fallen below a second threshold to control the transmitter to increase transmit power from the second power level to the first power level.

This allows transmission at increased power when appropriate. The first and second thresholds may be the same. Alternatively they may be different. When they are different, hysteresis is provided.

Optionally the controller is responsive to the at least one temperature sensor indicating that the temperature has risen above a third threshold to control the transmitter to reduce transmit power from the second power level to a third power level, wherein the third power level is a non-zero power level.

Provision of two different operational power levels less than the maximum power levels is advantageous since it allows for a finer resolution of control over the heat generated by the transmitter.

Optionally the controller is responsive to the at least one temperature sensor indicating that the temperature has risen above the third threshold to control the transmitter to reduce the transmit data rate from the second transmit data rate to a third transmit data rate, wherein the third transmit data rate is a non-zero transmit data rate.

This is of most applicability to WCDMA systems.

Optionally the controller is responsive to the at least one temperature sensor indicating that the temperature has fallen below a fourth threshold to control the transmitter to control the transmitter to increase transmit power from the third power level to the second power level.

This allows transmission at increased power when appropriate. The third and fourth thresholds may be the same. Alternatively they may be different. When they are different, hysteresis is provided.

The controller may be responsive to the at least one temperature sensor indicating that the temperature has risen above a maximum operating temperature threshold to switch the transmitter off. In this case, the controller may be responsive to the at least one temperature sensor indicating that the temperature has fallen below a switch on temperature threshold to switch the transmitter on. Optionally the maximum operating temperature threshold is different to the switch on temperature threshold, to provide hysteresis and prevent transmitted ping-ponging.

The controller may be responsive to the at least one temperature sensor indicating that the temperature has risen above a critical temperature threshold to write indicative data to memory. This can allow it to be determined at a later time whether the device has been submitted to excessive temperature.

The controller may comprise processing hardware operated under control of software. In certain embodiments, the controller comprises software running on a module including the transmitter and software running on a host device, for instance a laptop computer.

A second aspect of the invention relates to a method comprising responding to at least one temperature sensor indicating that a temperature has risen above a first threshold by controlling a transmitter to reduce a transmit power from a first power level to a second power level, wherein the second power level is a non-zero power level.

A third aspect of the invention relates to a computer program, preferably stored on a medium, comprising machine-readable instructions which when executed by computer apparatus cause the computer apparatus to perform a method comprising responding to at least one temperature sensor indicating that a temperature has risen above a first threshold by controlling a transmitter to reduce a transmit power from a first power level to a second power level, wherein the second power level is a non-zero power level.

Embodiments of the invention will now be described by way of example only, with reference to the accompanying drawings.

DETAILED DESCRIPTION OF THE EMBODIMENTS

Figure 1:
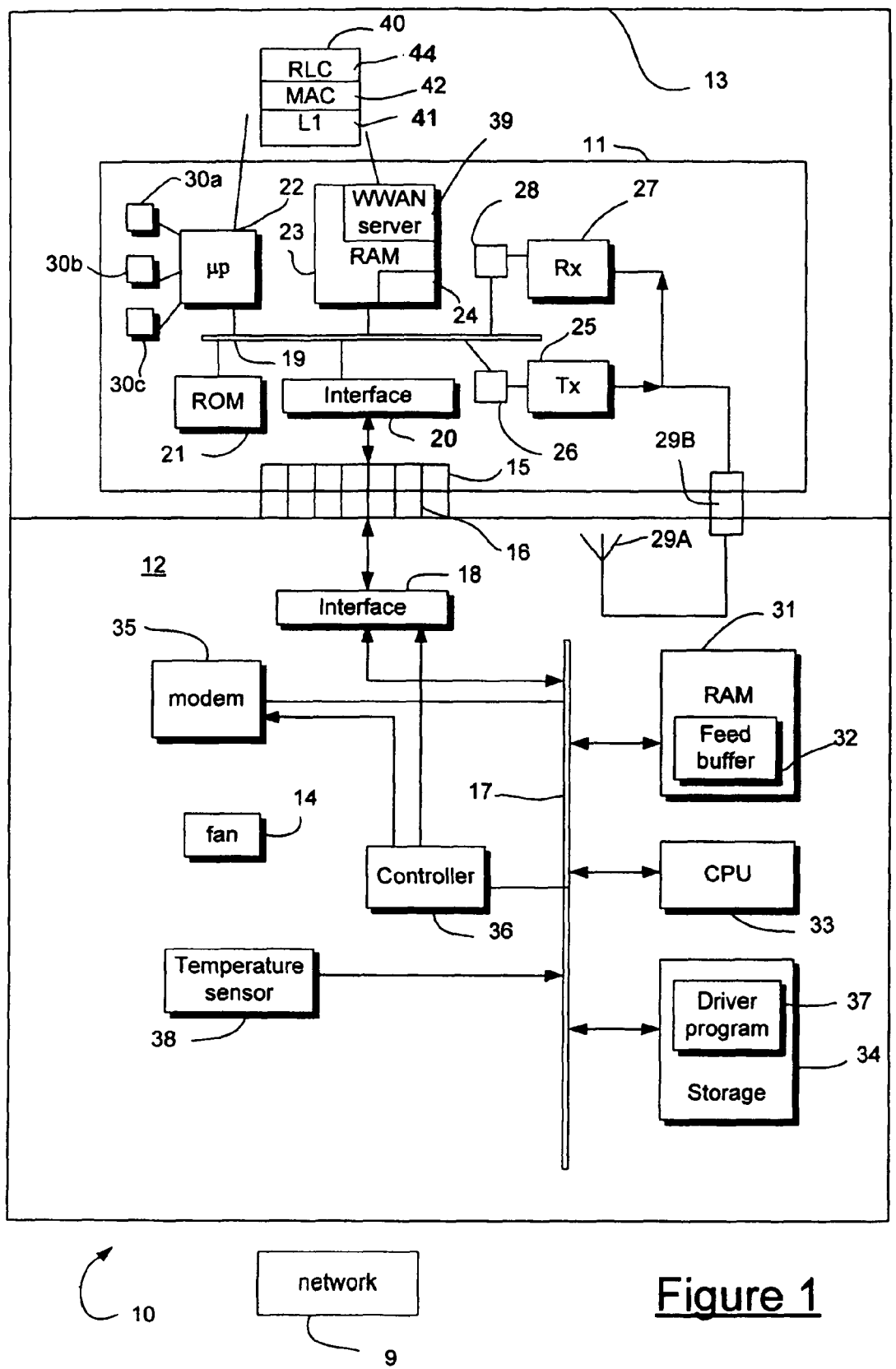
FIG. 1 is a schematic drawing of a system comprising a module and a laptop computer, the system embodying various aspects of the invention.

In the drawings, like reference numerals refer to like elements.

Referring to FIG. 1, a system 10 comprises a module 11 connected to a laptop computer 12. The module 11 is a 3G data card, implemented on a mini PCIe (PCI Express) card. The module 11 is internal to the laptop computer 12, in the sense that it is contained wholly within a housing 13 of the laptop computer 12 and cannot be removed therefrom without removing a cover (not shown) forming part of the housing. As such, the module is required to operate in a relatively high ambient temperature environment inside the laptop computer 12. The laptop computer 12 includes a fan 14 which is operable to expel hot air from within the housing 13 so as to maintain the temperature within the housing 13 within acceptable limits. As is usual, the fan 14 is operated only when necessary, and is operated at a speed which is appropriate taking into account the ambient temperature within the housing 13, as measured by a temperature sensor 38. The laptop computer is shown in very schematic form. It will be appreciated that the laptop computer 12 includes many other components (display, keyboard, graphics card, etc), components are omitted from the Figure because they are not useful in understanding the invention.

The laptop computer 12 includes a USB connector 15, which is mated with a corresponding USB connector 16 forming part of the module 11. Thus, the laptop computer 12 and the module 11 are able to communicate data and commands to one another. Furthermore, the USB connection allows the laptop computer 12 to provide electrical power to the module 11.

A bus 17 of the laptop 12 is connected to the USB connector 15, 16 by a hardware interface 18. Similarly, an interface 20 connects the USB connector 15, 16 to a bus 19 of the module 11.

The bus 19 of the module 11 allows communication between a number of devices, namely a ROM 21, a microprocessor 22, and some RAM 23. Some of the RAM 23 constitutes a transmit buffer 24 for the module 11. A transmitter 25 is connected to the bus 19 via a transmitter-bus interface 26. A receiver 27 is connected to the bus 19 via a receiver-bus interface 28. The transmitter 25 and the receiver are connected to and share a common antenna 29A, which is located in the laptop 12 and is coupled to the transmitter 25 and the receiver 27 by an antenna connector 29B. A temperature sensor 30 is connected to provide temperature measurements to the microprocessor 22.

The bus 17 of the laptop allows communication between some RAM 31, some of which constitutes a feed buffer 32 for the laptop 12, a CPU 33, storage 34, a dial-up modem 35 and a controller 36. Stored in the storage 34 is a program 37 constituting a driver for the USB interface 16, 18 and a user interface. Some functions of the driver part of the program 37 are described in more detail below. For the purposes of this explanation, the driver program 37 is considered to be part of the module 11, although it physically resides on the laptop 12.

The module 11 is a cellular radio transceiver. It is operable to communicate with a 3G mobile telephone network 9 according to a WCDMA (Wideband Code Division Multiple Access) communications protocol of the 3G standard. The module 11 may or may not be operable according to the Rel5 version, relating to HSDPA (High Speed Downlink Packet Access). The module 11 is subscribed to cellular data service provided by the network 9. This is achieved by the cooperation of the microprocessor 22 and the RAM 23 to implement a protocol stack 40. The protocol stack 40 is conventional. It includes a layer 1 (L1) 41. The L1 41 is also known as the WCDMA physical layer. Above the L1 41 is a MAC (Medium Access Control) layer 42. This layer is also known as a WCDMA L2 protocol layer. Above the MAC layer is an RLC (Radio Link Control) layer 44. This is also known as a WCDMA L3 protocol layer. The RLC layer 44 owns the transmit buffer 24. The protocol stack 40 is shown in the Figure, although it will be appreciated that it has no physical form but instead is formed by hardware operating under the control of software, relevant parts of which is held at run-time in the RAM 23.

Receiver operation is not described here since it is not relevant to this explanation. Transmit operation is as follows. The protocol stack 40 maintains the transmit buffer 24 in the RAM 23. The transmit buffer stores data received from the laptop 12 prior to transmission through the transmitter 25 through the antenna 29.

In WCDMA, a number of different transmit data rates are defined. A sample configuration is:

| Number of 336 bit blocks | User Data Rate [kbps] | Typical Weighting [User Data/Control Data] |
| --- | --- | --- |
| 12 | 384 | 15/4 |
| 4 | 128 | 15/8 |
| 2 | 64 | 15/15 |

It can be seen from this that reducing the number of 336 bit blocks transmitted reduces the user data rate and also reduces the ratio of user data to control data. The configurations are known by UEs (User Equipments) such as the module 11. the number of blocks transmitted per unit of time determines the user data rate. If the network 9 allows the module 11 to transmit at 12×336 bits every 10 ms, this gives a user data rate of 384 kbps. This means that there is available uplink (UL) capacity to transmit 384 kbps, and is termed a 384 kbps bearer.

Conventionally, the L1 protocol layer 41 of the module 11 causes transmission of the data that is queued in the transmit buffer 24. If there is no data in the transmit buffer 24, there is no transmission to the network 9. If there is sufficient data in the buffer, then convention is that transmission occurs at the configuration specified by the network 9.

However, if the amount of data in the transmit buffer 24 is less than the available uplink capacity, the MAC layer 42 reduces the transmit data rate by reducing the number of blocks of 336 bits. In this example, if the rate of data entering the transmit buffer is about 128 kbps, the L1 layer 41 requires only 4 blocks of data (each of 336 bits) per 10 ms slot. In this case, the MAC layer 42 automatically adapts the transmits configuration to use the 4×336 bit configuration (128 kbps bearer). Similarly, if the rate of data entering the transmit buffer is around 64 kbps, the L1 layer 41 requires only 2 blocks of data per 10 ms slot. In this case, the MAC layer 42 automatically adapts the transmits configuration to use the 2×336 bit configuration (64 kbps bearer).

If the rate of data entering the transmit buffer is between 64 kbps and 128 kbps, the L1 layer 41 switches between transmitting 2 blocks of data per 10 ms slot and 4 blocks of data per 10 ms slot. This occurs because the protocol stack 40 selects the number of blocks to transmit in a unit of time depending on the amount of data in the buffer. Similarly, if the rate of data entering the transmit buffer is between 0 kbps and 64 kbps, the L1 layer 41 switches between not transmitting and transmitting 2 blocks of data per 10 ms slot. Also, if the rate of data entering the transmit buffer is between 128 kbps and 384 kbps, the L1 layer 41 switches between transmitting 4 blocks of data per 10 ms slot and 12 blocks of data per 10 ms slot. Thus, by this scheme, the module 11 selects a transmit data rate which is dependent on the amount of data in the transmit buffer 24. This is conventional.

In addition to this, the network 9 may define Traffic Volume Measurements (TVM). TVM currently is not widely supported by 3G networks, but it has some advantages. A TVM is a measure of the amount of data queued in the transmit buffer 24. TVMs are calculated in the MAC layer 42. If a TVM exceeds a network-defined threshold, it is an indication that the available uplink capacity on the allocated bearer is insufficient. The module 11 informs the network 9, and the network 9 can choose to allocate a larger bearer, and the module 11 is notified as appropriate. Conversely, if the amount of data queued in the transmit buffer 24 is less than a network-defined threshold, it is an indication that the available uplink capacity on the allocated bearer is excessive. The module 11 informs the network 9, and the network 9 then reconfigures the module 11 to use a lower data rate bearer. For example, it may withdraw the 12×336 bit (384 kbps) configuration. In this case, the network 9 may allocate the bearer to one or more other users.

If the network 9 supports TVM, the module 11 still selects a transmit data rate which is dependent on the amount of data in the transmit buffer 24, although the transmit data rate cannot be greater than that allocated by the network 9.

The microprocessor 22 of the module 11 is arranged under control of a program permanently stored in the ROM 21 to monitor the temperature of the module 11. This program is a WWAN (Wireless Wide Area Network) server 39, which is described below. Monitoring of the temperature of the module 11 involves periodic interrogation of the temperature sensor 30, with the sensor 30 responding with a signal indicative of the temperature of the module 11. The exact way in which the temperature of the module 11 is monitored is not crucial to the invention. It is however preferred that the module 11 is provided with two or more temperature sensors.

In the embodiment of FIG. 1, the module 11 has three on-board temperature sensors 30a, 30b, 30c. The first sensor 30a is associated with an RF part of the module, which includes the transmitter 25 and the receiver 27. The second sensor 30b is associated with a VCTCXO (Voltage Controlled Temperature Compensated Oscillator) (not shown) which provides the transmitter 25 and the receiver 27 with oscillator signals. The third sensor 30c is associated with the RAM 23. For simplicity, the module temperature is taken to be the highest of the temperatures provided by the three sensors 30a-30c including any sensor tolerance. However, the temperature of the module 11 may instead be derived in any other suitable way.

The WWAN server 39 is run on the module 11 using the microprocessor 22 and the RAM 23 to cause the microprocessor 22 to monitor the temperature of the temperature sensors 30a, 30b, 30c and thus the temperature of the module 11. The WWAN server 39 of the module 11 causes the microprocessor 22 to report to the laptop 12 via the USB interface 15, 16 when the temperature of the module 11 crosses one of a number of predetermined thresholds.

Alternatively, the WWAN server 39 of the module 11 may be arranged to report, for instance periodically, the temperature of the module 11 to the laptop 12. Alternatively temperature reporting may occur in response to a request, generated by the program 37, to the WWAN server 39 for a temperature measurement.

Whichever way it is achieved, the laptop 12 is able to determine when the temperature sensors 30a-30c indicate that a temperature has risen above certain thresholds. The laptop 12 also is able to determine when the temperature sensors 30a-30c indicate that a temperature has fallen below certain thresholds. These determinations are made from data received over the USB interface 15, 16.

The driver program 37 causes the laptop 12 to adjust its operation on the basis of the monitored temperature of the module 11. In particular, the driver program 37 causes the laptop 12 to provide data to the module 11 for transmission at a rate which is dependent on the temperature of the module 11, as will now be described.

A number of temperature thresholds are defined. Example thresholds are:

| Threshold | Value [° C.] |
|---|---|
| TCritical | 80 |
| TRadioOff | 75 |
| TRadioOn | 73 |
| TThrottle2 | 70 |
| TThrottle1 | 65 |

Figure 2:
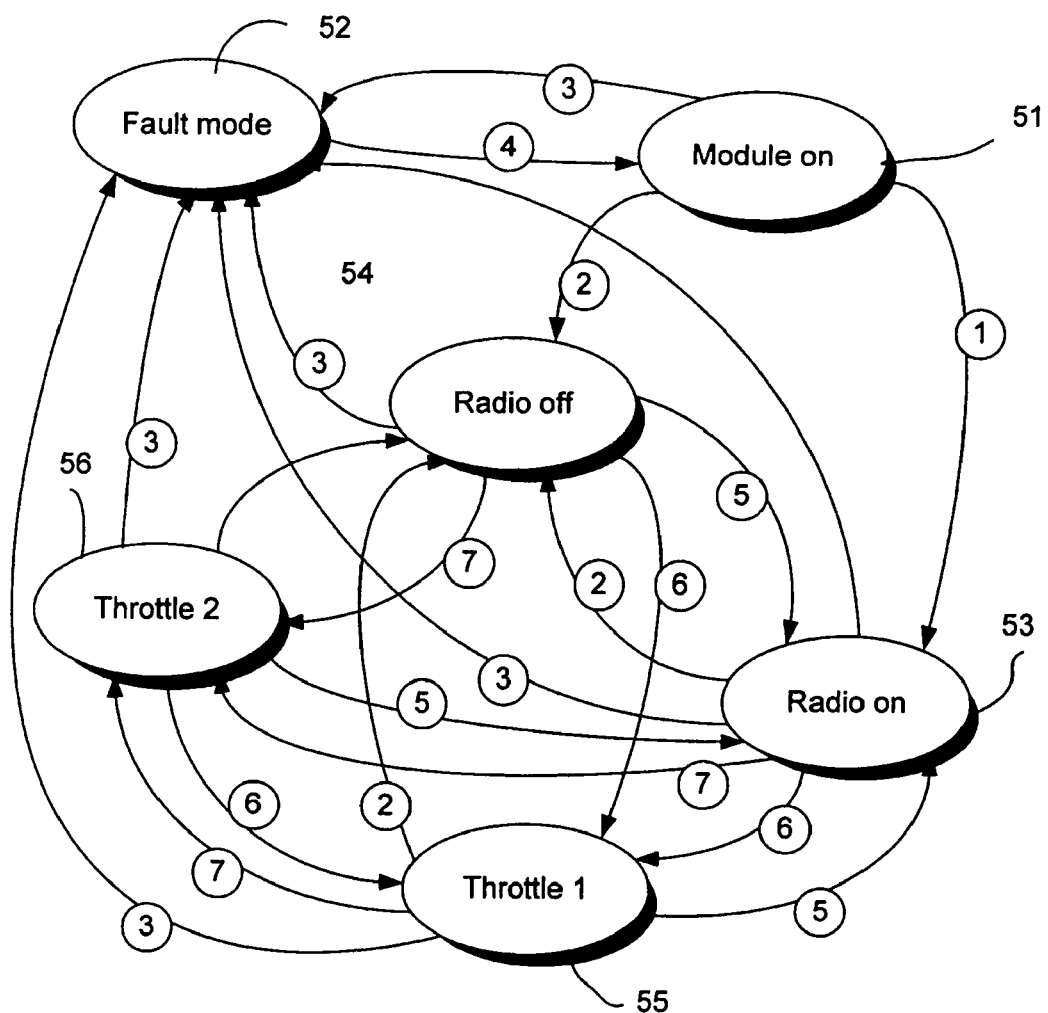
FIG. 2 is a state machine diagram illustrating operation of part if the FIG. 1 system.

The driver program is operable to operate in a state defined by the state machine diagram of FIG. 2. The driver can operate in one of six states: 'module on' 51, 'fault mode' 52, 'radio on' 53, 'radio off' 54, 'throttle 1' 55 and 'throttle 2' 56.

The 'module on' state 51 is entered when the laptop 12 boots up and power is applied to the module 11; or following recovery from the 'fault mode' 52. The WWAN server 39 reads the temperature of the module 11, and in conjunction with a software radio enable/disable feature (not shown) of the laptop 12, and W_DISABLE configurations, causes a state transition to 'radio off' state 54, 'radio on' state 53 or 'fault mode' state 52 as appropriate

| | |
|---|---|
| W_DISABLE state | Same state as when laptop 12 was last powered |
| USB state | Alive: state is transitory only |
| Module Processor State | MCU: Awake<br>DSP: Sleep |

The 'fault mode' state 52 is the fault condition and is only entered (from any state), when the module temperature exceeds a critical component temperature: TCritical. This can be used to prove that the warranty of the module 11 has been violated.

The module 11 first informs the laptop 12 that this state is being entered, and then enters a 'power down' state. This ensures that the module 11 is in its lowest operational state, even though power is still supplied to the module 11 by the USB interface 15, 16.

The laptop thermal design should be such that the 'fault mode' state 52 is never entered, as the excessive module temperature will be due a high ambient temperature in the laptop 12, and not from the module 11. However if this mode is entered, then the WWAN server 39 writes data to permanent memory (i.e. the ROM 21) to indicate that this has happened The 'fault mode' state 52 can only be exited when the laptop 12 reboots: 'module on' state 51 is then entered.

| | |
|---|---|
| W_DISABLE state | N/A |
| USB state | Selective Suspend |
| Module Processor State | MCU: Sleep<br>DSP: Sleep |

The 'radio on' state 53 is the usual operational state of the module 11. In this state, the module temperature is low enough to permit data transmission at full rate; and both software and hardware radio controls are set to enable a network connection. This state is left if either there is a rise in module temperature or there is a reason why the radio cannot be operated (e.g. on entering "flight mode", where radio operation is prohibited).

| | |
|---|---|
| W_DISABLE state | INACTIVE (High) |
| USB state | Cellular Idle: Selective Suspend with Remote Wakeup to report module temperature and signal strength; and Resume Signalling from laptop as necessary.<br>Cellular Connected: Interrupt EPs polled every 8 ms; BULK IN/OUT EPs posted when active data. |
| Module Processor State | Cellular Idle: MCU & DSP: Sleep, Awake for Page read<br>Cellular Connected: MCU & DSP: Fully Awake |

The 'radio off' state 54 is the mode in which communication to/from the network 9 is prohibited. The most likely triggers for entering this state are excessive module temperature and either software or hardware radio controls preventing radio operation (e.g. entering "flight mode"). The module 11 informs the laptop 12 that this state is being entered, and a timer is started in the laptop by the driver program 37. Once the timer (ElapsedTime) exceeds a predetermined value, equal to CoolingTime, the driver program 37 of the laptop 12 polls the WWAN server 39 to report the temperature of the module 11. The WWAN Server 39 then reads the module temperature and reports the temperature to the driver program 37. If the module temperature is still high, such that only the 'radio off' state 54 or the 'fault mode' state 52 can be entered, then the procedure is repeated, but with an increased CoolingTime timer value.

| | |
|---|---|
| W_DISABLE state | ACTIVE (Low) |
| USB state | Selective Suspend with occasional Remote Wakeup to report module temperature; and occasional Resume Signalling from laptop to request the temperature. |
| Module Processor State | MCU: Sleep, Awake only to make temperature measurements, or when instructed by laptop.<br>DSP: Sleep |

The 'throttle 1' state 55 is identical to the 'radio on' state 53, except that the UL data rate is throttled.

| | |
|---|---|
| W_DISABLE state | INACTIVE (High) |
| USB state | Cellular Idle: Selective Suspend with Remote Wakeup to report module temperature and signal strength; and Resume Signalling from laptop as necessary.<br>Cellular Connected: Interrupt EPs polled every 8 ms; BULK IN/OUT EPs posted when active data. |
| Module Processor State | Cellular Idle: MCU & DSP: Sleep, Awake for Page read<br>Cellular Connected: MCU & DSP: Fully Awake |

The 'throttle 2' state 56 is identical to the 'throttle 1' state 55, except that the UL data rate is throttled to an even lower data rate.

| | |
|---|---|
| W_DISABLE state | INACTIVE (High) |
| USB state | Cellular Idle: Selective Suspend with Remote Wakeup to report module temperature and signal strength; and Resume Signalling from laptop as necessary.<br>Cellular Connected: Interrupt EPs polled every 8 ms; BULK IN/OUT EPs posted when active data. |
| Module Processor State | Cellular Idle: MCU & DSP: Sleep, Awake for Page read<br>Cellular Connected: MCU & DSP: Fully Awake |

State change 1 (denoted by a 1 in a circle in the Figure) occurs only when power is first applied to the module (3.3 V rail), the WWAN server 39 detects that the module temperature is below TCritical, a software command is set to enable the WWAN radio, and a hardware W_DISABLE is disabled (high) to enable the WWAN radio. This causes the module to transition to the 'radio on' state 53.

State change 2 (denoted by a 2 in a circle in the Figure) occurs from either the initial power on ('module on' state 51) or 'radio on' state 53. This state change occurs only when the WWAN server 39 detects that the module temperature is above TRadioOff, but below TCritical, or software command is set to disable the WWAN radio, or hardware W_DISABLE is (low) to disable the WWAN radio. With this state change, the module 11 transitions to the 'radio off' state 54.

State change 3 (denoted by a 3 in a circle in the Figure) can occur from any state. It occurs when the WWAN server 39 detects that the module temperature is above TCritical, the state change is into the 'fault mode' 52.

State change 4 (denoted by a 4 in a circle in the Figure) occurs when the module is in the 'fault mode' state 52 and the laptop 12 powers off and reboots. Here, the module leaves the 'fault mode' state 52 and transitions to the 'module on' state 51 such that "normal" operation can be resumed. This is the only recovery from the 'fault mode' state 52.

State change 5 (denoted by a 5 in a circle in the Figure) occurs from any state where there are restrictions on radio operation (disabled or throttled). This state change occurs when the WWAN server 39 detects that the module temperature is below Tthrottle1 and TRadioOn, and a software command is set to enable the WWAN radio, and the hardware W_DISABLE is disabled (high) to enable the WWAN radio. With this state change, the module 11 transitions to the 'radio on' state 53, where radio operation is unrestricted.

State change 6 (denoted by a 6 in a circle in the Figure) can occur from any operational state. It occurs when the WWAN server 39 detects that the module temperature is above TThrottle1, but below TRadioOn and a software command is set to enable the WWAN radio, and the hardware W_DISABLE is disabled (high) to enable the WWAN radio. With this state change, the module 11 transitions to the 'throttle 1' state 55.

State change 7 (denoted by a 7 in a circle in the Figure) can occur from any operational state. It occurs when the WWAN server 39 detects that the module temperature is above TThrottle2, but below TRadioOn and a software command is set to enable the WWAN radio, and the hardware W_DISABLE is disabled (high) to enable the WWAN radio. With this state change, the module 11 transitions to the 'throttle 2' state 56.

Some of the terms above, e.g. W_DISABLE, are specific to PCI miniaturecard, although it will be appreciated that corresponding interrupts can be used in other implementations.

The provision of two throttling stages for WCDMA/HSDPA allows for design flexibility and future algorithm tuning.

To switch off the transmitter 25, the cellular software and radio are disabled. This simplifies the interface between the protocol software 40 and the WWAN server 39, compared to merely disabling the transmitter. This does result in the module 11 disconnecting from the network 9, so an indication of this is provided to software of the laptop 12. When the module 11 cools sufficiently, the cellular software and radio can be re-enabled and the module 11 performs a cell search and re-registers with the network 9.

An algorithm implementing the state machine of FIG. 2 exists in the driver program 37. This allows all the data passing over USB can be throttled, not merely the data over NDIS (Network Driver Interface Specification). This means that data sent over the dial-up modem 35 also can be throttled should this be necessary. The dial-up modem and the USB interface are selectively enabled by a controller 36.

The driver program 37 creates the feed buffer 32. The driver program 37 starts a timer, ticking at a fixed rate, only when there is data in the feed buffer 32. The tick period can be called the "Throttle Timer Period". When no throttling is present, i.e. the module is in 'radio on' state 53, the rate at which data is sent over the USB connection 15, 16 is governed by conventional flow control in the protocol software 40. When the 'Throttle1' state 55 is entered, a cap on the amount of data sent over the USB connection 15, 16 in the Throttle Timer Period is made. The first cap is a maximum amount of data that can be sent, and corresponds to x bytes. When the 'Throttle2' state 56 is initiated, a second cap on the amount of data sent over the USB connection in the Throttle Timer Period is made. The second cap corresponds to y bytes, where x>y. x and y may be configurable dynamically, but they preferably are fixed. The second cap (y bytes) corresponds to the lowest possible UL data rate, i.e. 64 kbps. The first cap (x bytes) corresponds to the next lowest data rate, i.e. 128 kbps. The values of x and y depends on the length of the Throttle Timer Period, but it is easy for the driver program 37 to calculate suitable values.

The driver program 37 thus defines plural contiguous and sequential time periods, each having a length equal to the Throttle Timer Period, and limits the amount of data that is fed to the USB interface in each of the time periods. Thus, although data can be transmitted burstily, taking an average using a resolution less than the Throttle Timer Period provides a throttled and steady feeding data rate. To ensure that the burstiness of the data feeding does not cause problems with the module 11, the amount of data that is transmitted in one Throttle Timer Period preferably is small compared to the size of the transmit buffer 24.

The data is sent from the feed buffer 32 to the module 11 via the USB connection 15, 16 at the usual full-speed USB data rate of 12 Mbps. Data rate control is effected by inserting delays between packets. The effect of this is that the data entering the module 11, and hence the protocol software stack 40, is in bursts. If the module 11 is in either of the throttle1 and throttle2 states 55, 56, the average data rate is controlled by the driver program 37 to be the required data rate mentioned above. The value of the Throttle Timer Period is selected so as to allow smooth operation of the module 11, i.e. is small enough so as to prevent the transmit data rate selected by the protocol stack 40 or the network 9 from unnecessary switching but is large enough so as to allow full size packets to be sent from the feed buffer 32 to the module 11 whilst achieving the required average data rate.

When throttling data flow from the feed buffer 32 to the module 11, the module 11 normally will for a short time continue to transmit data at higher data rate. After the data rate has begun to be throttled, the fact that the transmit data rate is significantly greater than the rate at which data is entered into the transmit buffer 24 from the laptop 12 means that the buffer begins to empty of data. After a short time, the amount of data stored in the buffer falls to a point where the L1 layer 41 determines that the transmit data rate is too high. At this time, the L1 layer 41 changes the transmit data rate to a lower rate. The reduction in transmit data rate occurs immediately the L1 layer 41 calculates the new required block size.

Although there is a possibility of a reduction in transmission data rate causing overflow of the transmit buffer or the loss of data, feeding data from the feed buffer correctly can ensure that the possibility is no greater than if transmission had continued at the greater data rate.

If the network 9 supports TVM, the reduced amount of data in the buffer can cause the network 9 to remove some bearer from that allocated to the module 11.

Whether or not the network 9 supports TVM, the adjustment of the data rate passing to the transmit buffer 24 over the USB connection 15, 16 results in the protocol software 40 automatically reducing the transmit data rate, and thus reducing the amount of heat generated by the module 11. This is achieved without any change to the protocol software 40, which thus can be conventional.

There is not any prioritization between real-time and non-real-time data flows at the USB driver level. In embodiments where there is prioritization, this is handled at a higher level (e.g. TCP/IP Protocol Driver).

The fact that the driver program 37 resides in the laptop 12 means that it does not have any negative effect on other programs. The presence of the driver program 37 on the laptop 12 also is advantageous since the availability of the RAM 31 means that more data can be buffered on the laptop 12 than could be buffered on the module 11.

The effect of this operation is a reduction in transmit power, and thus a reduction in generated heat, when the module 11 is hot. Reducing the heat generated by the module 11 increases the probability of the module 11 being able to continue. Put another way, reducing the transmit data rate decreases the likelihood that the module 11 will reach its maximum operating temperature and thus be switched off.

The inventors have found that, for WCDMA (including HSDPA), the only way to reduce transmitter power is to reduce the transmit data rate. If the module 11 reduces transmit power without reducing data rate, the mobile phone network 9 requests the module 11 to increase the transmit power up to the correct level. In WCDMA, because there is less spreading of the data at higher data rates, the need to achieve the required signal-to-noise ratio when transmitting at a higher data rate gives rise to higher power consumption.

In WCDMA, the network 9 defines a different transmit power for each of the UL (uplink) data rates that the network 9 supports. This is achieved by weighting the relative powers for the control data and user data. The power savings resulting from the above mentioned sample configuration are:

| Number of 336 bit blocks | User Data Rate [kbps] | Typical Weighting [User Data/Control Data] | Estimated Drop in Tx power [dB] |
|---|---|---|---|
| 12 | 384 | 15/4 | — |
| 4 | 128 | 15/8 | 5 |
| 2 | 64 | 15/15 | 9 |

If the user data rate drops, then the module can use a lower weighting which in turn equates to a lower transmit power. In the example, if the transmit data rate decreases from 384 kbps to 64 kbps, the transmit power decreases by approximately 9 dB. It will be appreciated, though, that any decrease in transmit power resulting from a reduced transmit data rate is solely dependent on the configuration of the weightings for each data rate set by the network 9, which are known by UEs.

In the above example, reduction by the MAC layer 42 of the transmit data rate from 384 kbps to 128 kbps results in a reduction in transmit power of approximately 5 dB.

The reduction in heat generation when throttling is achieved whether or not the network supports TVM.

Figure 3:
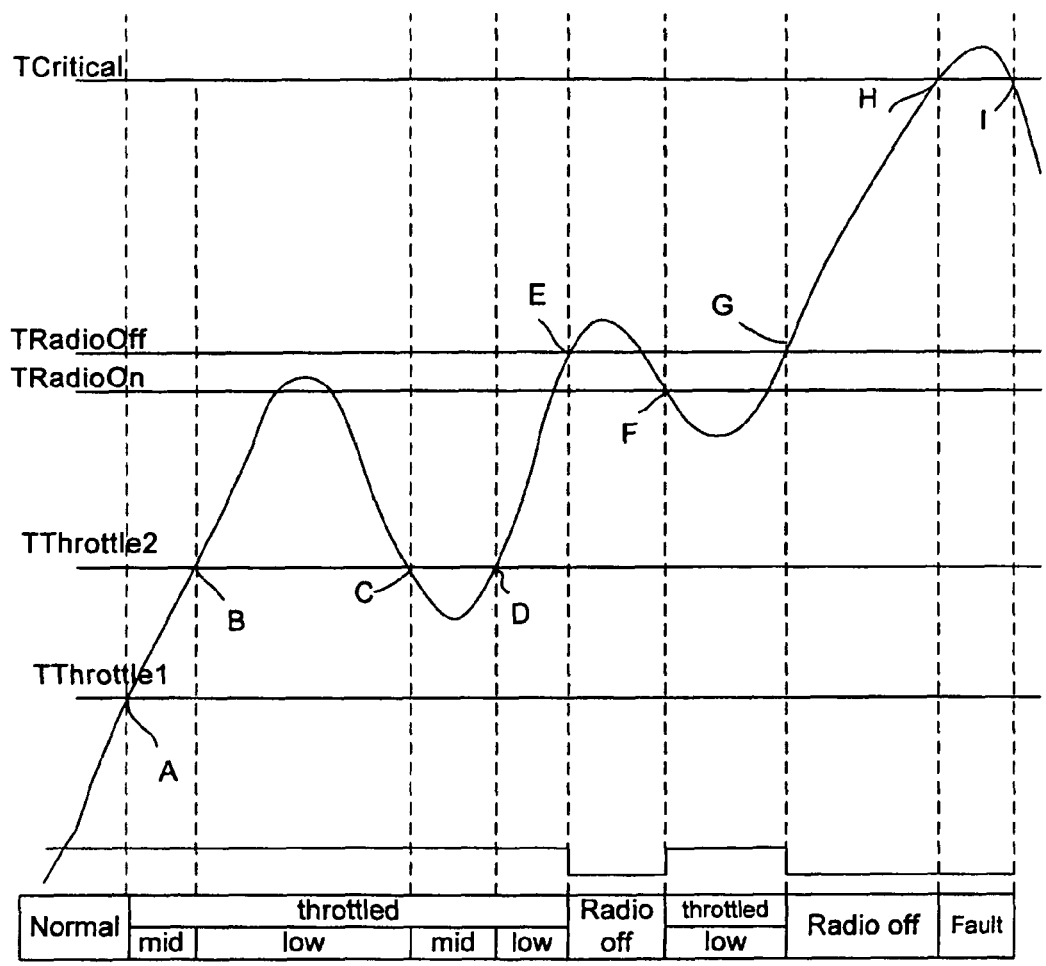
FIG. 3 is a drawing illustrating operation of the FIG. 1 system in certain conditions.

An example operation of the algorithm implemented in the driver program 37 is shown in FIG. 3. In this Figure, the thresholds TCritical, TRadioOff, TRadioOn, TThrottle2 and TThrottle1 are shown horizontally. Temperature is on the vertical axis and time is on the horizontal axis. A line shows how module temperature changes over time. Before a point A, the module is in the 'radio on' state 53. at point A, the temperature of the module 11=rises above the TThrottle1 threshold. This causes the module 11 to transition to the 'throttle 1' state 55, having a medium data rate. This reduces the data rate and thus the amount of heat generated by the module 11. The temperature of the module 11 continues to rise, perhaps because of heat generated by other components within the laptop 12. At point B, the temperature rises above the Tthrottle2 threshold. This causes the module 11 to transition to the 'throttle 2' state 56. This reduces the data rate to a low data rate, and thus reduces further the amount of heat generated by the module 11. The temperature of the module rises further above the TRadioOn threshold, which does not cause any transitions, then at point C falls below the TThrottle2 threshold. This causes the module 11 to transition to the 'throttle 1' state 55. This increases the data rate, and thus the amount of heat generated by the module 11.

At point D, the temperature again rises above the TThrottle2 threshold. This causes the module 11 to transition to the 'throttle 2' state 56. This again reduces the data rate, and thus the amount of heat generated by the module 11. The temperature of the module 11 then rises above the TRadioOn threshold, which does not cause any transitions, then at point E rises above the TRadioOff threshold. This causes the module to transition to the 'radio off' state 54. The temperature of the module 11 then falls below the TRadioOff threshold, which does not cause any transitions, then at point F rises below the TRadioOn threshold. This causes the module to transition to the 'throttle 2' state 56.

The temperature of the module 11 then rises again above the TRadioOn threshold, which again does not cause any transitions, then at point G rises above the TRadioOff threshold. This causes the module to transition to the 'radio off' state 54. At this stage, the module 11 is generating little or no heat. The temperature of the module 11 continues to rise, because of external heat sources, until at point H it rises above the TCritical threshold. At this point, the module 11 transitions to 'fault mode' state 52. Here, the module 11 writes to permanent memory that fault mode was entered. Operation of the radio cannot begin again until the temperature falls below the TRadioOn threshold.

From this, it will be seen that the TRadioOn and TRadioOff provide hysteresis, which help to prevent a ping-pong effect. Hysteresis is not applied on the throttling thresholds since it is thought that ping-ponging between data rates is not particularly problematic.

In another embodiment, the two throttling thresholds could be used as a single throttling threshold with hysteresis.

In a further embodiment, only one throttle state is defined. In this case, the module 11 may in an operational state either be 'radio on', 'throttle' or 'radio off'. This may be achieved using the algorithm described above by a small modification of the temperature thresholds, as follows:

| Threshold | Value [° C.] |
|---|---|
| TCritical | 80 |
| TRadioOff | 75 |
| TRadioOn | 70 |
| TThrottle2 | 70 |
| TThrottle1 | 65 |

The invention is applicable to transmitters operating according to standards other than WCDMA standards.

Although the above embodiment relates to a PCIe miniaturecard internal to a laptop computer 12, the skilled person will appreciate that the invention has broader applicability than this. For instance, the invention in some instances can be embodied as a module which largely is external to a laptop computer or other device. Thus, the invention may be applicable to WCDMA (including HSDPA) cards or modules which are connectable with PCMCIA slots and the like such that a part of the card or module is internal and part is external.

The invention is applicable in some aspects also to apparatus in which a radio module is connected to another device without a specific interface, for instance when the module and the device are hard-wired together.

The invention is applicable also to mobile telephones, smart phones, PDAs (Personal Digital Assistants) and the like which have internal or partly internal transceiver modules.

In some applications, the one or more temperature sensors on the output of which decisions are made may not be associated specifically with the module itself, but may be located at any suitable position within the host device.

The invention claimed is:

1. Apparatus comprising:
a feed buffer;
a transmit buffer;

a radio transmitter;

at least one temperature sensor; and one or more controllers, wherein:

the one or more controllers are configured to control the radio transmitter to transmit data from the transmit buffer at a transmit data rate, the transmit data rate being dependent on the amount of data stored in the transmit buffer;

the one or more controllers are configured to cause data to be fed from the feed buffer to the transmit buffer, the one or more controllers are configured to receive signals from the at least one temperature sensor, wherein each signal is indicative of a temperature;

the one or more controllers are responsive to receiving from the at least one temperature sensor signals indicating that the temperature has crossed from below to above a first threshold to reduce a feeding rate at which data is fed from the feed buffer to the transmit buffer from a first predetermined rate to a second predetermined rate, wherein the second predetermined rate is non-zero, thereby to control the radio transmitter to reduce transmit power from a first power level to a second power level, wherein the second power level is a non-zero power level;

the one or more controllers are responsive to receiving from the at least one temperature sensor signals indicating that the temperature has crossed from below to above a second threshold to switch the radio transmitter off, wherein the second threshold is a maximum operating temperature threshold; and the one or more controllers are responsive to receiving from the at least one temperature sensor signals indicating that the temperature has crossed from above to below a third threshold to switch the radio transmitter on, wherein the third threshold is a switch on temperature threshold, and wherein the second threshold is different to the third temperature threshold.

2. The apparatus as claimed in claim 1, wherein the one or more controllers are responsive to receiving from the at least one temperature sensor signals indicating that the temperature has crossed from above to below a fourth threshold to increase the feeding rate at which data is fed from the feed buffer to the transmit buffer from the second predetermined rate to the first predetermined rate, thereby to control the radio transmitter to increase transmit power from the second power level to the first power level.

3. The apparatus as claimed in claim 1, wherein the one or more controllers are responsive to receiving from the at least one temperature sensor signals indicating that the temperature has crossed from below to above a fifth threshold to reduce the feeding rate at which data is fed from the feed buffer to the transmit buffer from the second predetermined rate to a third predetermined rate wherein the third predetermined rate is a non-zero, thereby to control the radio transmitter to reduce transmit power from the second power level to a third power level, wherein the third power level is a non-zero power level.

4. The apparatus as claimed in claim 3, wherein the one or more controllers are responsive to receiving from the at least one temperature sensor signals indicating that the temperature has crossed from above to below a sixth threshold to increase the feeding rate at which data is fed from the feed buffer to the transmit buffer from the third predetermined rate to the second predetermined rate, thereby to control the radio transmitter to increase transmit power from the third power level to the second power level.

5. The apparatus as claimed in claim 1, wherein the one or more controllers are responsive to receiving from the at least one temperature sensor signals indicating that the temperature has crossed from below to above a seventh threshold to write indicative data to memory, wherein the seventh threshold is a critical temperature threshold.

6. The apparatus as claimed in claim 1, wherein the one or more controllers comprise processing hardware operated under control of software.

7. The apparatus as claimed in claim 1, the one or more controllers being configured to control the feeding rate of data from the feed buffer to the transmit buffer by limiting the amount of data that is sent in each of plural consecutive time periods.

8. The apparatus as claimed in claim 7, the apparatus further comprising a timer, the apparatus being configured to control the feeding rate of data from the feed buffer to the transmit buffer by being configured:

to start the timer;

after the timer started, to feed data to the transmit buffer until a predetermined amount of data has been fed to the feed buffer, and to refraining from feeding data to the feed buffer until following expiration of the timer.

9. The apparatus as claimed in claim 1, comprising an interface between the transmit buffer and the feed buffer, wherein the temperature sensors are provided on the transmit buffer side of the interface.

10. A method comprising:

controlling a radio transmitter to transmit data from a transmit buffer at a transmit data rate, the transmit data rate being dependent on the amount of data stored in the transmit buffer;

receiving signals from at least one temperature sensor, each signal being indicative of a temperature;

feeding data from a feed buffer to the transmit buffer at a first predetermined feeding rate;

responding to receiving signals from the at least one temperature sensor, said signals indicating that the temperature has crossed from below to above a first threshold, by reducing the feeding rate at which data is fed from the feed buffer to the transmit buffer from the first predetermined rate to a second predetermined rate, wherein the second predetermined rate is non-zero, thereby controlling the radio transmitter to reduce a transmit power from a first power level to a second power level, wherein the second power level is a non-zero power level;

responding to receiving from the at least one temperature sensor signals indicating that the temperature has crossed from below to above a second threshold by switching the radio transmitter off, wherein the second threshold is a maximum operating temperature threshold; and responding to receiving from the at least one temperature sensor signals indicating that the temperature has crossed from above to below a third threshold by switching the radio transmitter on, wherein the third threshold is a switch on temperature threshold, and wherein the second threshold is different to the third temperature threshold.

11. The method as claimed in claim 10, comprising responding to receiving from the at least one temperature sensor signals indicating that the temperature has crossed from above to below a fourth threshold by increasing the feeding rate at which data is fed from the feed buffer to the transmit buffer from the second predetermined rate to the first predetermined rate, thereby controlling the transmitter to increase transmit power from the second power level to the first power level.

12. The method as claimed in claim 10, comprising responding to receiving from the at least one temperature sensor signals indicating that the temperature has crossed from below to above a fifth threshold by reducing the feeding rate at which data is fed from the feed buffer to the transmit buffer from the second predetermined rate to a third predetermined rate wherein the third predetermined rate is a non-zero, thereby controlling the transmitter to reduce transmit power from the second power level to a third power level, wherein the third power level is a non-zero power level.

13. The method as claimed in claim 10, comprising responding to receiving from the temperature sensor signals indicating that the temperature has crossed from below to above a seventh threshold by writing indicative data to memory, wherein the seventh threshold is a critical temperature threshold.

14. The method as claimed in claim 10, comprising controlling the feeding rate of data from the feed buffer to the transmit buffer by limiting the amount of data that is sent in each of plural consecutive time periods.

15. The method as claimed in claim 14, comprising controlling the feeding rate of data from the feed buffer to the transmit buffer by repeating a sequence comprising:
   starting a timer;
   after the timer started, feeding data to the transmit buffer until a predetermined amount of data has been fed to the feed buffer; and
   refraining from feeding data to the feed buffer until following expiration of the timer.

16. A computer program, stored on a medium, comprising machine-readable instructions which when executed by computer apparatus cause the computer apparatus to perform a method comprising:
   controlling a radio transmitter to transmit data from a transmit buffer at a transmit data rate, the transmit data rate being dependent on the amount of data stored in the transmit buffer;
   receiving signals from at least one temperature sensor, each signal being indicative of a temperature;
   feeding data from a feed buffer to the transmit buffer at a first predetermined feeding rate;
   responding to receiving signals from the at least one temperature sensor, said signals indicating that a temperature has crossed from below to above a first threshold, by reducing the feeding rate at which data is fed from the feed buffer to the transmit buffer from the first predetermined rate to a second predetermined rate, wherein the second predetermined rate is non-zero, thereby controlling the radio transmitter to reduce a transmit power from a first power level to a second power level, wherein the second power level is a non-zero power level;
   responding to at least one temperature sensor signals indicating that the temperature has crossed from below to above a second threshold by switching the radio transmitter off, wherein the second threshold is a maximum operating temperature threshold; and
   responding to receiving from the at least one temperature sensor signals indicating that the temperature has crossed from above to below a third threshold by switching the radio transmitter on, wherein the third threshold is a switch on temperature threshold, and wherein the second threshold is different to the third temperature threshold.

* * * * *